(12) United States Patent
Parkes

(10) Patent No.: US 10,126,328 B1
(45) Date of Patent: Nov. 13, 2018

(54) ELECTRICAL MEASUREMENT TEST FIXTURE

(71) Applicant: Department of the Navy, Indian Head, MD (US)

(72) Inventor: John Parkes, Randolph, NJ (US)

(73) Assignee: The United States of America as Represented by the Secretary of the Navy, Washington, DC (US)

(*) Notice: Subject to any disclaimer, the term of this patent is extended or adjusted under 35 U.S.C. 154(b) by 164 days.

(21) Appl. No.: 15/330,902

(22) Filed: Nov. 15, 2016

(51) Int. Cl.
  *G01R 31/02* (2006.01)
  *G01R 1/04* (2006.01)
  *G01R 15/12* (2006.01)

(52) U.S. Cl.
  CPC ......... *G01R 1/0433* (2013.01); *G01R 1/0416* (2013.01); *G01R 15/125* (2013.01)

(58) Field of Classification Search
  CPC ... H04W 52/54; H04W 76/10; H04W 92/045; G01R 1/00; G01R 31/02; G01R 27/28; G01R 31/021; G01R 31/024; G01R 31/025; G01R 31/026; G01R 35/00; G01R 1/0433; G01R 1/0416; H04N 5/2257; H01R 13/5841
  See application file for complete search history.

(56) References Cited

U.S. PATENT DOCUMENTS

| | | | | |
|---|---|---|---|---|
| 2,822,519 A | * | 2/1958 | Murphy | G01R 31/023 324/538 |
| 3,818,329 A | * | 6/1974 | Reaves, Jr. | G01R 31/021 324/540 |
| 3,982,180 A | * | 9/1976 | Vaiden | G01R 31/023 324/522 |
| 4,472,677 A | | 9/1984 | Rowe | |
| 4,814,693 A | | 3/1989 | Coben | |
| 4,870,347 A | | 9/1989 | Cicerone | |
| 5,177,447 A | | 1/1993 | Marino et al. | |

OTHER PUBLICATIONS https://en.wikipedia.org/wild/Breakout_box.

* cited by examiner

*Primary Examiner* — Vinh Nguyen
(74) *Attorney, Agent, or Firm* — Fredric J. Zimmerman

(57) ABSTRACT

An electrical test fixture includes a printed wiring board (PWB) and a pair of cable connectors for connecting to a device to be tested. The test fixture includes jacks for a digital multi meter and a multi meter bus on the PWB. On/off switches on the PWB correspond to circuit elements in the device to be tested. The cable connecters are connected to the PWB using contact pins and flexible stranded wires crimped to the contact pins.

8 Claims, 3 Drawing Sheets

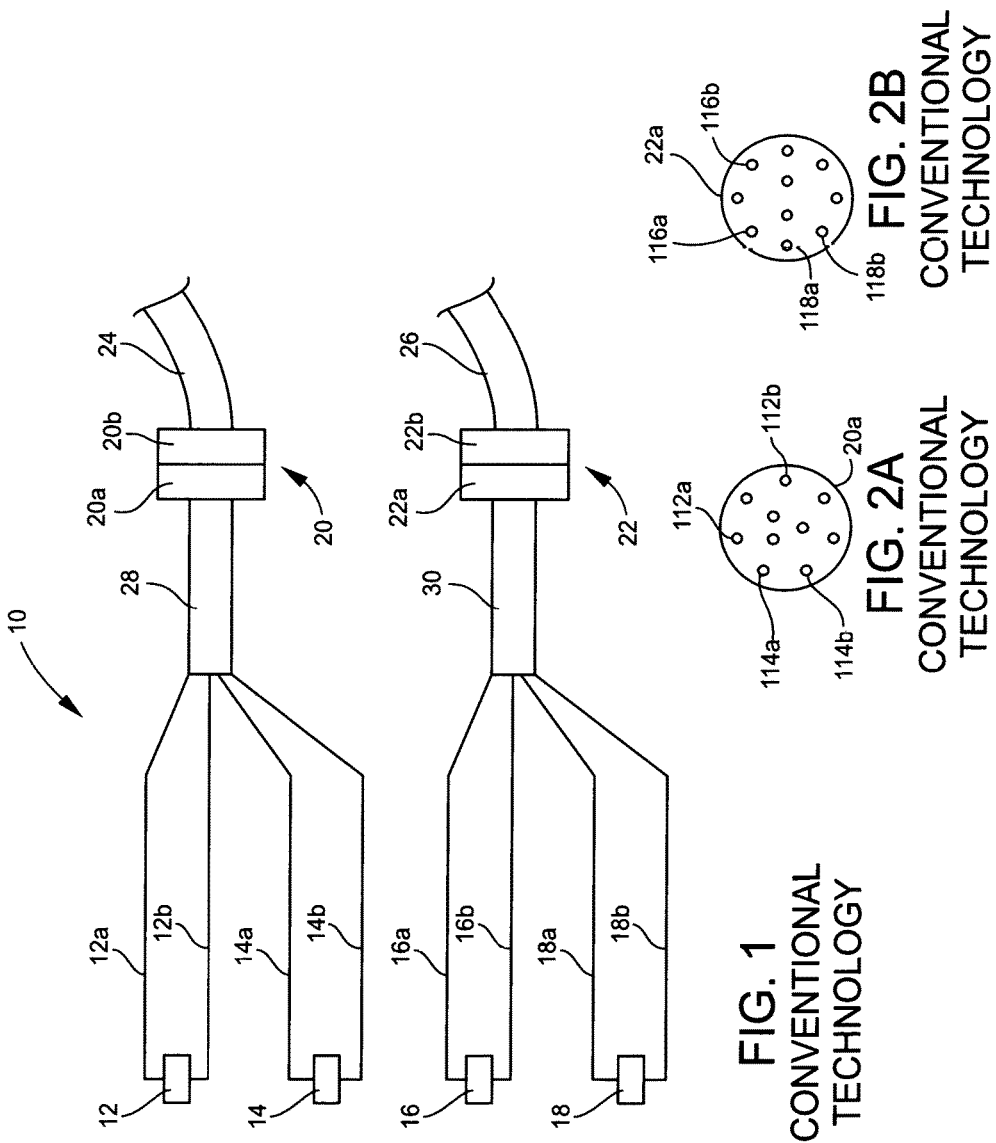

ELECTRICAL MEASUREMENT TEST FIXTURE

STATEMENT OF GOVERNMENT INTEREST

The invention described herein may be manufactured and used by or for the Government of the United States of America for Governmental purposes without the payment of any royalties thereon or therefor.

FIELD OF THE INVENTION

The invention relates in general to electrical test tools and in particular to electrical test tools used in connection with devices that have multiple circuit elements and input/output cables with multiple conductors.

BACKGROUND OF THE INVENTION

Some electrical devices include multiple circuit elements. FIG. 1 is a schematic of a conventional electrical device 10 having a plurality of circuit elements 12, 14, 16, 18. While four circuit elements are shown in FIG. 1, many more circuit elements may be present in device 10. The circuit elements may be active and/or passive. Some examples of active circuit elements are relays, solenoids, triacs, transistors and operational amplifiers. Some examples of passive circuit elements are resistors, capacitors, inductors, diodes and switches. The circuit elements are periodically checked to ensure that the electrical device 10 functions properly. Power and signal to and from the electrical device 10 and circuit elements 12-18 may be provided by input/output cables 24, 26. Cables 24, 26 may have multiple conductors. These cables may be connected to the device 10 with cable connectors such as conventional cable connectors 20 and 22.

The conventional cable connectors 20, 22 may include mating halves 20a, 20b and 22a, 22b. The mating half 20a may include pin contacts 112a, 112b and 114a, 114b (FIG. 2A). The mating half 22a may include pin contacts 116a, 116b and 118a, 118b (FIG. 2B). The mating halves 20b and 22b may include socket contacts (not shown). Or, the arrangement of pin contacts and socket contacts may be reversed. The pin contacts in the cable connectors 20a, 22a may be connected to the circuit elements 12-18 by cables 28, 30 containing conductors, such as conductors 12a, 12b, 14a, 14b, 16a, 16b, 18a, 18b. Of course, additional conductors may be provided for additional circuit elements and may be connected to respective pin contacts in the connectors 20a, 22a.

In some devices 10, a pair of conductors, such as conductors 18a and 18b, may be attached to different connectors. For example, conductor 18a may be attached to mating half 20a and conductor 18b may be attached to mating half 22a. To test the multiple circuit elements 12-18 in the device 10, the cable connectors 20b and 22b may be disconnected from the connectors 20a, 22a, respectively. This disconnection exposes the pin contacts 112a, 112b, 114a, 114b, 116a, 116b, 118a, 118b (FIGS. 2A and 2B) in the connectors 20a and 22a.

The pin contacts or socket contacts in the connectors 20a, 22a may be used to test the circuit elements 12-18 in the device 10. The two probes of a digital multi meter may be manually placed in contact with an appropriate pair of contacts in one or more of the cable connectors 20a, 22a. Because of the large number of contacts in the connectors (up to 50 or more), it is easy to place the multi meter probes in contact with an incorrect pair of contacts. In addition, even if the correct contacts are selected, electrical contact between the probes and the contacts can be less than optimal, resulting in incorrect electrical measurements. In addition, some electrical devices are located in cramped areas with little space and lighting, which increases the odds of choosing incorrect contacts and/or contacting the contacts in a less than optimal manner.

For example, certain surface ships of the U.S. Navy are equipped with guns, such as the MK 45, that have anti-icing electrical devices as part of the gun installation. The anti-icing device may be, for example, a heat blanket in the form of a rubberized mat containing a plurality of heating elements (resistors) and thermistors. In one installation, a heat blanket may contain as many as 26 resistors and thermistors. Power and signal to and from the heat blanket are supplied by a pair of multi-conductor cables that are connected to the heat blanket with cylindrical connectors. Periodic condition assessment and diagnostics include measuring the resistance of the 26 resistors and thermistors in the blanket via the contacts in the cylindrical connectors. The contacts in the connectors are difficult to identify given the location of the heat blanket cable connectors. In addition, the procedure is cumbersome and prone to inaccurate readings. Incorrect resistance measurements can lead to the scrapping of a satisfactory heat blanket, which may result in unneeded costs, for example, on the order of at least $100,000 to remove and replace the heat blanket.

A need exists for a reliable and accurate electrical measurement test fixture to connect to the cables of electrical devices having a plurality of circuit elements.

SUMMARY OF THE INVENTION

One aspect of the invention is an electrical test fixture for testing an electrical device. The electrical device may have a plurality of circuit elements and a first cable connector with a plurality of first conductors. The electrical test fixture may include a printed wiring board (PWB) and a second cable connector fixed to the PWB. The second cable connector is configured to mate with the first cable connector of the device. The second cable connector includes a plurality of second conductors. Each of the second conductors is individually fixed at one end to the PWB.

A pair of digital multi meter input jacks are fixed to the PWB. A plurality of on/off switches are mounted on the PWB. An electrical bus on the PWB connects the pair of digital multi meter input jacks to each of the plurality of on/off switches. The PWB includes a plurality of pairs of conductive tracks. Each pair of conductive tracks connect one of the plurality of on/off switches to a selected pair of the plurality of second conductors individually fixed to the PWB. Each selected pair of the plurality of second conductors forms part of a circuit with one of the plurality of circuit elements in the device.

The electrical device may include a third cable connecter having a plurality of third conductors. The test fixture may further comprise a fourth cable connector fixed to the PWB. The fourth cable connector is configured to mate with the third cable connector of the device. The fourth cable connector includes a plurality of fourth conductors where each of the fourth conductors is individually fixed at one end to the PWB.

The test fixture may include a second plurality of pairs of conductive tracks on the PWB. Each pair of the second plurality of pairs of conductive tracks connects one of the plurality of on/off switches to a selected pair of the plurality of fourth conductors individually fixed to the PWB. Each selected pair of the plurality of fourth conductors forms part of a circuit with one of the plurality of circuit elements in the device.

The plurality of circuit elements may include passive and/or active circuit elements. The passive circuit elements may include, for example, resistors and thermistors.

Each of the plurality of second conductors includes one of a contact pin and a contact socket. A flexible stranded wire is crimped to the one of the contact pin and the contact socket. The PWB further includes a plurality of openings. The flexible stranded wires are disposed in respective ones of the plurality of openings. The end of each of the second conductors, which is rigidly fixed to the PWB, is an end of one of the flexible stranded wires.

The invention will be better understood, and further objects, features, and advantages thereof will become more apparent from the following description of the exemplary embodiments, taken in conjunction with the accompanying drawings.

BRIEF DESCRIPTION OF THE DRAWINGS

In the drawings, which are not necessarily to scale, like or corresponding parts are denoted by like or corresponding reference numerals.

FIG. 1 is a schematic of an example of a conventional electrical device which may be tested with the invention.

FIG. 2A is a schematic of an example of a conventional cable connector used with the device of FIG. 1.

FIG. 2B is a schematic of an example of a conventional cable connector used with the device of FIG. 1.

DETAILED DESCRIPTION OF THE INVENTION

Figure 3:
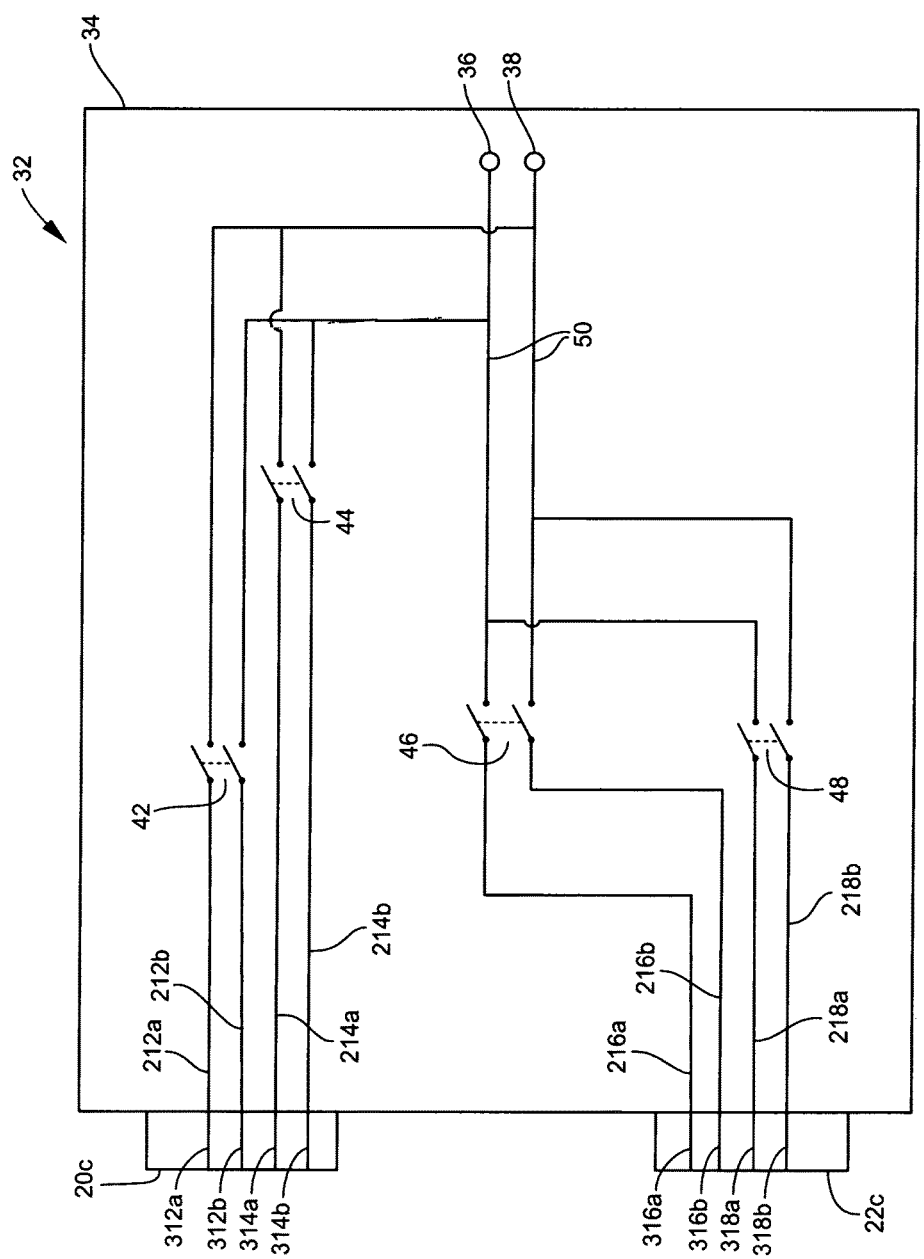
FIG. 3 is a schematic of one exemplary embodiment of an electrical test fixture for testing an electrical device.

Referring to the schematic of FIG. 3, one exemplary embodiment of an electrical test fixture 32 for testing an electrical device 10 includes a printed wiring board (PWB) 34. One or more cable connectors are fixed to the PWB 34. For example, connectors 20c and 22c may be fixed to the PWB 34 in a manner to be described in more detail below. Connectors 20c and 22c are configured to mate with connectors 20a and 22a (FIG. 1), respectively. In this manner, test fixture 32 is electrically connected to device 10. Connectors 20c and 22c may be fixed on the same side or opposite sides of PWB 34. PWB 34 may be a multi-layered board.

PWB (Board) 34 includes a pair of digital multi meter input jacks 36, 38 configured for connection to a digital multi meter. A plurality of on/off switches 42, 44, 46 and 48 are mounted on the PWB 34. In an exemplary embodiment, switches 42-48 are momentary, normally off, push button on/off switches. While four on/off switches are shown, many more switches may be used. In general, the number of on/off switches is the same as the number of circuit elements in the electric device 10 that are desired to be tested. An electrical bus 50 formed in the PWB 34 connects the multi meter input jacks 36, 38 to each of the plurality of on/off switches 42-48.

PWB 34 includes a plurality of pairs of conductive tracks 212a, 212b, 214a, 214b, 216n, 716b, 218a, 218b, which are situated on the PWB 34. Each pair of conductive tracks 212a, 212b, 214a, 214b, 216a, 216b, 218a, 218b connects a respective on/off switch 42, 22, 46, 48 to a corresponding pair of conductors 312a, 312b, 314a, 314b, 316a, 316b, 318a, 318b in connectors 20c and 22c. Conductors 312a, 312b, 314a, 314b, 316a, 316b, 318a, 318b are individually fixed to the PWB 34. When connectors 20a and 22a are mated with connectors 20c and 22c, respectively, the conductors 312a, 312b, 314a, 314b, 316a, 316b, 318a, 318b form part of an electrical circuit with respective circuit elements 12-18 in the device 10.

For example, the circuit of element 12 includes conductors 12a, 12b; pin contacts 112a and 112b in connector 20a; contacts (conductors) 312a and 312b in connector 20c; conductors 212a and 212b on PWB 34; and switch 42 on PWB 34. Similar circuits are formed by the other circuit elements 14, 16 and 18 and their corresponding conductors and connector contacts.

Figure 4:
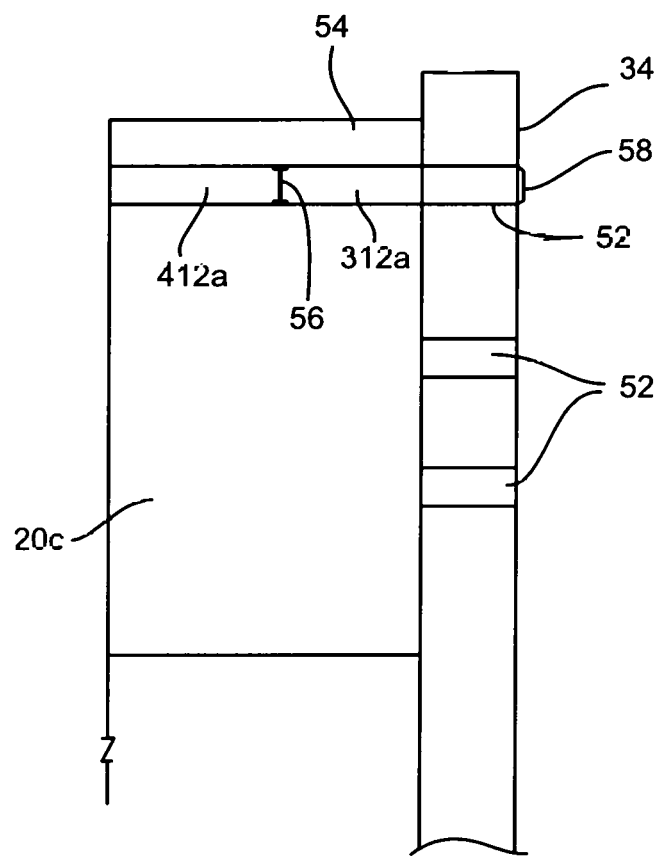
FIG. 4 is an enlarged side schematic view showing one exemplary way to fix a connector to the electrical test fixture.

FIG. 4 is an enlarged side schematic view showing one way to fix connector 20c and its contacts (conductors) to the PWB 34. In FIG. 3, Connector 22c is fixed in a similar manner as connector 20c. For simplicity, only one conductor 312a is shown in FIG. 4. The shell or body 54 of connector 20c may be rigidly fixed to PWB 34 using, for example, screws (not shown). PWB 34 includes a through hole 52 for each connector wire, such as connector wire 312a of connector 20c. The connector wires are selected for high strand count (for flexibility) and thin insulation thickness. Flexibility of the connector wires is important. The connectors 20c, 22c may be MIL-SPEC circular connectors that require special preparation to enable them to be economically assembled to the PWB 34. These connector types are generally used to terminate discrete wires and are not designed to be used directly on a PWB. This configuration is so because each pin (or socket), such as pin 412a of the connector 20c, must be crimped onto each individual wire 312a and then individually inserted into the connector body 54. The pins 412a need to be able to float a bit within the connector body 54 to enable smooth and reliable connection with the mating connector 20a.

Each connector pin, such as pin 412a, is crimped onto a pre-cut length of flexible wire 312a. Alternatively, the flexible wire 312a, which may be flexible stranded wire, is crimped to each connector pin, such as pin 412a. The crimped area is shown as numeral 56 in FIG. 4. Each wire and pin is inserted into the connector body 54. Each wire is threaded or inserted through a corresponding hole 52 in PWB 34. The plated hole 52 in the PWB 34 that receives each connector wire 312a is sized to accommodate the wire diameter including its insulating jacket. The wire itself is selected for wire strand flexibility and minimum insulation jacket thickness. After the wires are inserted into the PWB and the connector body is secured to the PWB by the mounting hardware, the connector 20c is mated with a dummy mating connector. The insulation on each wire is pulled back enough to clear the solder side of the PWR. The wire is then soldered at solder area 58 with the minimum amount solder and then trimmed close to the PWB 34. The insulation pulling, soldering and trimming continues until all wires are soldered. This method allows the discrete wire connectors to be used on this type of test fixture. The wire 312a remains flexible even though it is crimped at one end to pin 412a and soldered at the other end to PWB 34. The flexibility of wire 312a enables the mating half of a connector with many pins (for example, 30 or more) to be connected to connector 20c.

Test fixture 32 may be used in the following manner. First, on electrical device 10, connectors 20b and 22b are disconnected from connectors 20a and 22a, respectively. Then, test fixture 32 is connected to device 10 by attaching connectors 20a and 22a to connectors 20c and 22c, respectively. A digital multi meter is connected to fixture 32 via jacks 36, 38. Circuit element 12 is tested by pressing and holding on/off switch 42 in the on position. In the on position, switch 42 completes the circuit of circuit element 12 and enables electrical measurements to be taken with the multi meter. Releasing switch 42 moves the switch to the off position. A similar method is used to test the other circuit elements 14, 16 and 18. The utility of test fixture 32 is readily apparent when the number of circuit elements increases. For example, the heat blanket discussed in the Background of the Invention includes 26 circuit elements. The test fixture 32 enables fast and accurate measurements of large numbers of circuit elements.

Any numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. An electrical test fixture for testing an electrical device, the electrical device includes a plurality of circuit elements and a first cable connector with a plurality of first conductors, the electrical test fixture, comprising:
   a printed wiring board (PWB); a second cable connector being fixed to the PWB, the second cable connector is configured to mate with the first cable connector of the device, the second cable connector includes a plurality of second conductors, wherein each of the plurality of second conductors comprise one first end individually fixed to the PWB; a pair of digital multi meter input jacks being fixed to the PWB; a plurality of on/off switches being mounted on the PWB; an electrical bus on the PWB connecting the pair of digital multi meter input jacks to each of the plurality of on/off switches; and a first plurality of pairs of conductive tracks being situated on the PWB, each pair of the first plurality of conductive tracks connects one of the plurality of on/off switches to a selected pair of the plurality of second conductors individually fixed to the PWB, each selected pair of the plurality of second conductors forms part of a circuit with one of the plurality of circuit elements in the device,
   wherein each of the plurality of second conductors includes one of a contact pin and a contact socket, wherein each of the plurality of second conductors includes a flexible stranded wire crimped to said one of the contact pin and the contact socket, wherein the PWB further comprises a plurality of openings with the flexible stranded wires disposed in respective ones of the plurality of openings, wherein said one first end of each of the second conductors, which is rigidly fixed to the PWB, mates with a second end of one of the flexible stranded wires, and wherein said one first end of each of the second conductors, which is rigidly fixed to the PWB, is soldered to the PWB.

2. The test fixture of claim 1, wherein the plurality of circuit elements includes passive circuit elements.

3. The test fixture of claim 2, wherein the passive circuit elements include resistors and thermistors.

4. The test fixture of claim 2, wherein the passive circuit elements include resistors and thermistors, and wherein a number of passive circuit elements is greater than twenty.

5. The test fixture of claim 1, wherein the first cable connectors and the second cable connectors are circular cable connectors.

6. The test fixture of claim 1, wherein the electrical device is a heat blanket.

7. An electrical test fixture for testing an electrical device, the device includes a plurality of resistive circuit elements and a first cable connector with a plurality of first conductors, the electrical test fixture comprising:
   a printed wiring board (PWB);
   a second cable connector being fixed to the PWB, the second cable connector is configured to mate with the first cable connector of the device, the second cable connector includes a plurality of second conductors, wherein each of the second conductors comprises one first end individually fixed to the PWB; a pair of digital multi meter input jacks being fixed to the PWB; a plurality of on/off switches being mounted on the PWB; an electrical bus on the PWB connecting the pair of digital multi meter input jacks to each of the plurality of on/off switches; and a first plurality of pairs of conductive tracks being situated on the PWB, each pair of the first plurality of conductive tracks connects one of the plurality of on/off switches to a selected pair of the plurality of second conductors individually fixed to the PWB, each selected pair of the plurality of second conductors forms part of a circuit with one of the plurality of circuit elements in the device,
   wherein each of the plurality of second conductors includes a contact pin and a flexible stranded wire crimped to the contact pin, wherein the PWB further comprises a plurality of openings with the flexible stranded wires disposed in respective ones of the plurality of openings, and wherein said one end of each of the second conductors, which is rigidly fixed to the PWB, mates with a second end of one of the flexible stranded wires.

8. An apparatus, comprising:
   an electrical device, the device comprises a plurality of circuit elements and a first cable connector with a plurality of first conductors; and an electrical test fixture comprising, a printed wiring board (PWB); a second cable connector being fixed to the PWB, wherein the second cable connector is connected to the first cable connector of the electrical device, wherein the second cable connector includes a plurality of second conductors, and wherein each of the second conductors is individually fixed at one first end to the PWB; a pair of digital multi meter input jacks being fixed to the PWB; a plurality of on/off switches being mounted on the PWB; an electrical bus on the PWB connects the pair of digital multi meter input jacks to each of the plurality of on/off switches; and a plurality of pairs of conductive tracks being situated on the PWB, each pair of the plurality of conductive tracks connects one of the plurality of on/off switches to a selected pair of the plurality of second conductors, which is individually fixed to the PWB, each selected pair of the plurality of second conductors forms part of a circuit with one of the plurality of circuit elements in the device, wherein each of the plurality of second conductors includes a contact pin and a flexible stranded wire crimped to the contact pin, wherein the PWB further comprises a plurality of openings with the flexible stranded wires disposed in respective ones of the plurality of openings, and wherein said one first end of each of the second conductors, which is rigidly fixed to the PWB, mates with a second end of one of the flexible stranded wires.

\* \* \* \* \*